United States Patent
Mohanty

(10) Patent No.: US 11,581,871 B1
(45) Date of Patent: Feb. 14, 2023

(54) NONLINEAR ACOUSTIC MEDIUM

(71) Applicant: FemtoDx, Inc., Beverly Hills, CA (US)

(72) Inventor: Pritiraj Mohanty, Beverly Hills, CA (US)

(73) Assignee: FemtoDx, Inc., Beverly Hills, CA (US)

( * ) Notice: Subject to any disclaimer, the term of this patent is extended or adjusted under 35 U.S.C. 154(b) by 891 days.

(21) Appl. No.: 16/269,499

(22) Filed: Feb. 6, 2019

Related U.S. Application Data

(60) Provisional application No. 62/626,834, filed on Feb. 6, 2018.

(51) Int. Cl.
| | | |
|---|---|---|
| *H03H 9/54* | (2006.01) | |
| *H03H 9/52* | (2006.01) | |
| *H03H 9/24* | (2006.01) | |
| *H03B 19/00* | (2006.01) | |
| *H03H 9/02* | (2006.01) | |
| *H03H 9/00* | (2006.01) | |
| *H03H 9/15* | (2006.01) | |

(52) U.S. Cl.
CPC ............... *H03H 9/54* (2013.01); *H03B 19/00* (2013.01); *H03H 9/0095* (2013.01); *H03H 9/0207* (2013.01); *H03H 9/02228* (2013.01); *H03H 9/2405* (2013.01); *H03H 9/525* (2013.01); *H03H 2009/155* (2013.01); *H03H 2009/241* (2013.01)

(58) Field of Classification Search
CPC ............. H03H 9/02228; H03H 9/2405; H03H 9/2436; H03H 2009/241; H03H 9/0095; H03H 9/462; H03H 9/0207; H03H 2009/155; H03H 9/15; H03H 9/171; H03H 9/176; H03B 5/326; H03B 19/00
See application file for complete search history.

(56) References Cited

U.S. PATENT DOCUMENTS

| 9,000,854 B1 * | 4/2015 | Mohanty | ................ H03B 5/326 331/116 R |
|---|---|---|---|
| 2009/0295506 A1 * | 12/2009 | Handtmann | ......... H03H 9/0207 29/25.35 |
| 2010/0181868 A1 * | 7/2010 | Gaidarzhy | ........... H03H 9/0095 310/313 B |

OTHER PUBLICATIONS

Collado, Carlos, et al. "Nonlinear effects of SiO 2 layers in bulk acoustic wave resonators." IEEE Transactions on Microwave Theory and Techniques 66.4 (2017): 1773-1779. (Year: 2017).*

(Continued)

*Primary Examiner* — Ryan Johnson
(74) *Attorney, Agent, or Firm* — Wolf, Greenfield & Sacks, P.C.

(57) ABSTRACT

Nonlinear acoustic media and related methods are described herein. The nonlinear acoustic media are configured to generate higher harmonic output signals from a single-frequency input signal. The higher harmonic output signals can be generated through the coupling of an acoustic dielectric medium to a nonlinear piezoelectric medium having four ports.

2 Claims, 4 Drawing Sheets

(56) References Cited

OTHER PUBLICATIONS

Collado, Carlos, et al. "Nonlinear distributed model for bulk acoustic wave resonators." IEEE transactions on microwave theory and techniques 57.12 (2009): 3019-3029. (Year: 2009).*

Rocas, Eduard, et al. "Electro-thermo-mechanical model for bulk acoustic wave resonators." IEEE transactions on ultrasonics, ferroelectrics, and frequency control 60.11 (2013): 2389-2403. (Year: 2013).*

Pan, Wanling, and Farrokh Ayazi. "Thin-film piezoelectric-on-substrate resonators with Q enhancement and TCF reduction." 2010 IEEE 23rd international conference on micro electro mechanical systems (MEMS). IEEE, 2010. (Year: 2010).*

* cited by examiner

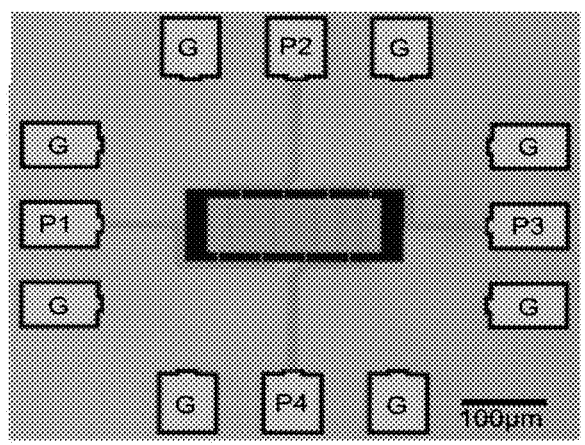 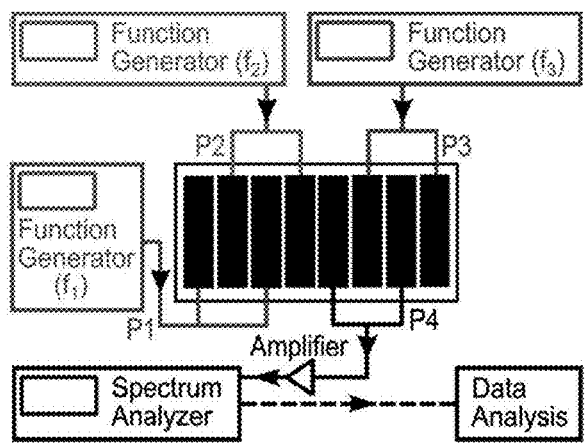
FIG. 1A
FIG. 1B

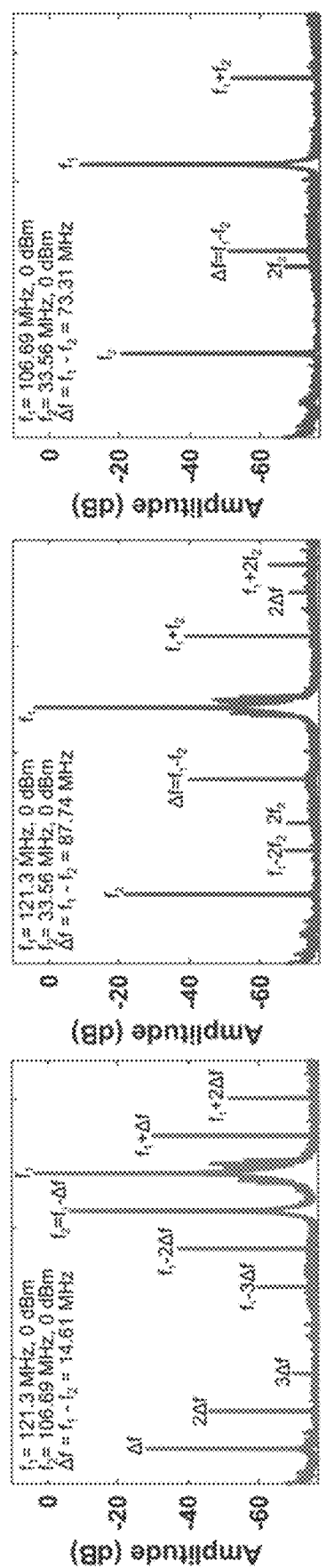
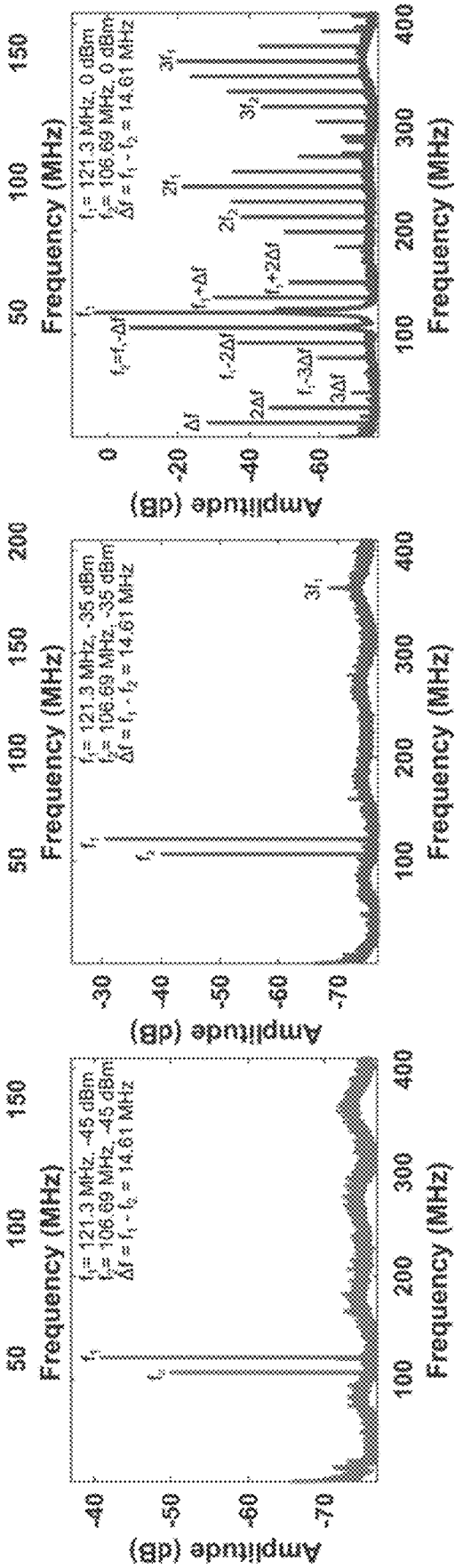
FIG. 3A  FIG. 3B  FIG. 3C
FIG. 3D  FIG. 3E  FIG. 3F

NONLINEAR ACOUSTIC MEDIUM

RELATED APPLICATIONS

This application claims priority to U.S. Provisional Application No. 62/626,834, filed Feb. 6, 2018, which is incorporated herein by reference in its entirety.

FIELD

This invention relates generally to nonlinear acoustic media and related methods.

BACKGROUND

The nonlinear relation between electric field and polarization response in certain classes of materials is at the heart of nonlinear optics. In its simplest manifestation, Second Harmonic Generation (SHG) combines two identical photons of frequency $\omega_1$ to form a single photon with twice the frequency ($\omega_2=2\omega_1$). SHG is the most commonly employed commercial technique for frequency doubling of lasers. Similarly, if two photons of dissimilar frequencies ($\omega_1$ and $\omega_2$) are applied, frequency sums and differences can be generated. The next order nonlinear effect, Third Harmonic Generation (THG), can take an input of three photons with different frequencies and generate photons with frequencies that are algebraic combinations of sums and differences of the input frequencies, with a special case being frequency tripling. This is also known as four-wave mixing. Other SHG-related fundamental effects include optical rectification, Pockel's effect and parametric amplification, and THG-related effects include Kerr nonlinearity and nonlinear Raman scattering.

Analogous nonlinear effects in acoustics, utilizing phonons instead of photons, could provide similar benefits of harmonic generation, phase conjugation, parametric oscillation and scattering effects.

SUMMARY

Nonlinear acoustic media and related methods are described herein.

In one aspect, nonlinear acoustic media are provided. The nonlinear acoustic media are configured to generate higher harmonic output signals from a single-frequency input signal. The higher harmonics are generated through the coupling of a nonlinear acoustic medium to a nonlinear piezoelectric medium.

In one aspect, a method is provided. The method comprises generating higher harmonic output signals using a nonlinear acoustic media from a single-frequency input signal by coupling the nonlinear acoustic medium to a nonlinear piezoelectric medium.

Other aspects, embodiments, and features of the invention will become apparent from the following detailed description.

BRIEF DESCRIPTIONS OF THE FIGURES

FIG. 1A is a micrograph of the four-port micromechanical resonator described further below.

FIG. 1B shows a schematic of the resonator described further below.

FIG. 3A shows a plot of amplitude versus frequency for a first set of input signals as described in the Example.

FIG. 3B shows a plot of amplitude versus frequency for a second set of input signals as described in the Example.

FIG. 3C shows a plot of amplitude versus frequency for a third set of input signals as described in the Example.

FIG. 3D shows a plot of amplitude versus frequency for a fourth set of input signals as described in the Example.

FIG. 3E shows a plot of amplitude versus frequency for a fifth set of input signals as described in the Example.

FIG. 3F shows a plot of amplitude versus frequency for a sixth set of input signals as described in the Example.

Figure 4A:
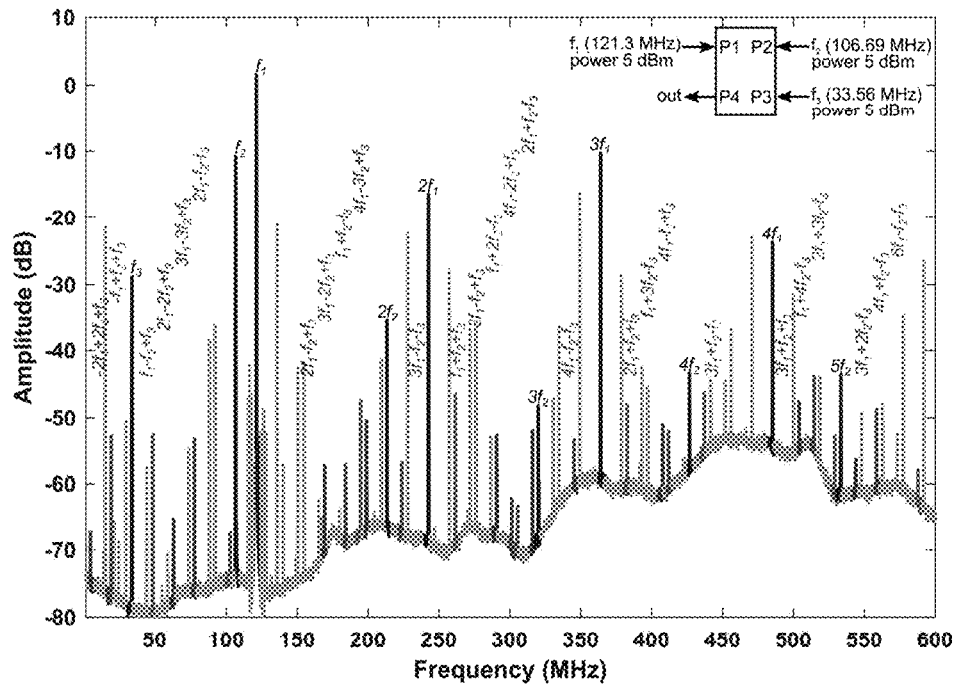
Figure 4B:
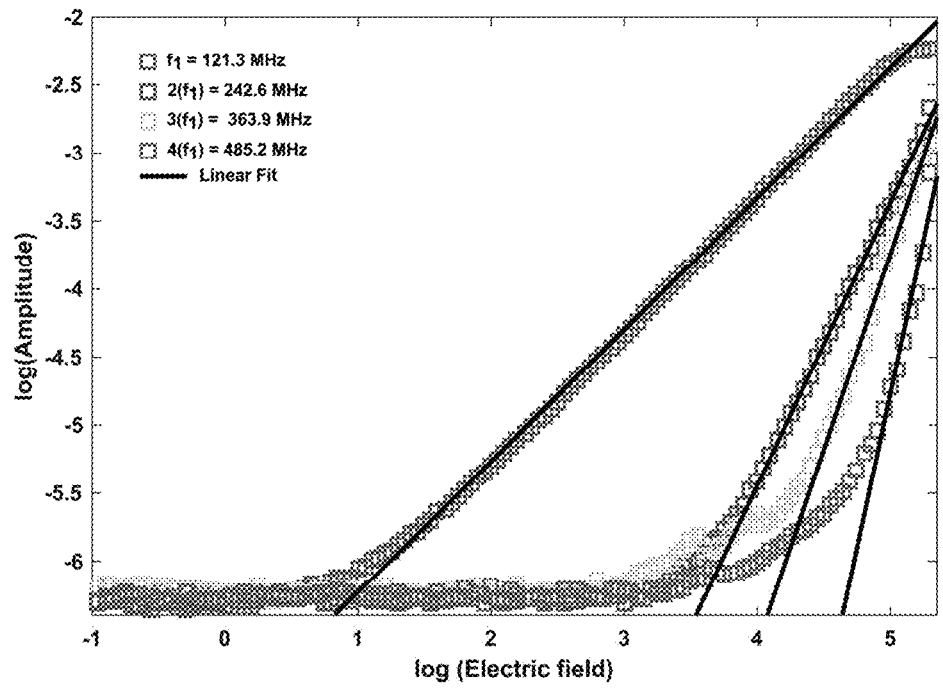

FIGS. 4A and 4B respectively show plots of amplitude versus frequency and log(Amplitude) versus log (Electric Field) for different sets of input signals as described in the Example.

DETAILED DESCRIPTION

Nonlinear acoustic media and related methods are described herein. The nonlinear acoustic media are configured to generate higher harmonic output signals from a single-frequency input signal. The higher harmonics are generated through the coupling of a nonlinear acoustic medium to a nonlinear piezoelectric medium. Use of this coupling enables reduction in device size to the point where large enough electric fields to promote nonlinear behavior are achievable with accessible voltages.

The techniques described herein are an approach to achieving an acoustic nonlinear medium by combining a nonlinear dielectric with an elastic system. Piezoelectric transduction connects the two formalisms by converting electric fields to mechanical strain and stress. An applied mechanical stress is converted to an electric field, which, at high field strengths, and in a nonlinear medium such as a piezoelectric material, can generate second and third order electrical polarization effects. The resulting higher-order components in polarization then result, through the piezoelectric effect, in higher harmonic acoustic components, that is, mechanical vibrations at the higher harmonic frequencies. Any suitable system including an electrically nonlinear piezoelectric materials coupled to a mechanical system creates a nonlinear acoustic medium according to the techniques described herein.

Importantly, reducing the size of the elastic system to a micromechanical resonator with micron-scale electrode separation enables application of electric fields approaching a regime, about a million volt/m, where the dielectric nonlinearity in the material starts to appear. This dielectric nonlinearity is fundamentally different from mechanical nonlinearity, which arises from a nonlinear spring constant, such as in a Duffing oscillator, or nonlinear damping.

Application of an external field in a dielectric material creates a response field inside the material due to polarization, reducing the field strength inside the dielectric material.

The polarization field $\vec{P}$ in many materials is directly proportional the external field:

$$\vec{P} = \varepsilon_0 \chi_e^{(1)} \vec{E} \tag{1}$$

where $\varepsilon_0$ is the permittivity of free space $\chi_e^{(1)}$ is the linear (first-order) susceptibility. The total field inside of the material $\vec{E}$ is both due to the free charges given by the displacement field $\vec{D}$, and the bound charges given by $\vec{P}$, hence $\vec{D}=\varepsilon_0\vec{E}+\vec{P}$. For a linear dielectric, $\vec{D}=\varepsilon\vec{E}$, where the dielectric constant is $\varepsilon=\varepsilon_0(1+\chi_e^{(1)})$.

For nonlinear dielectrics, as the intensity of the electric field is increased beyond the linear regime, $\vec{P}$ is expanded in powers of electric field with coefficients $\chi^{(n)}$ corresponding to the n-th order susceptibility:

$$\vec{P}=\varepsilon_0\chi_e^{(2)}[\vec{E}]^2+\varepsilon_0\chi_e^{(3)}[\vec{E}]^3+\ldots \quad (2)$$

Symmetry of the material plays a key role in that the second term, responsible for second harmonic generation, is exactly zero in materials, such as silicon, that have centrosymmetric crystalline structures. However, these coefficients can be nonzero in non-centrosymmetric crystals that also display the piezoelectric effect. Thus, second harmonic generation can be produced in such piezoelectric materials. In some embodiments, the material is AN. The techniques described herein cover all piezoelectric materials used to create nonlinear acoustic media.

In the presence of a high intensity field in a dielectric medium, the system can be modeled as an oscillator with a nonlinear restoring force and a driving electric field consisting of two-frequency components $\omega_1$ and $\omega_2$, such that $E(t)=E_1 e^{i\omega_1 t}+E_2 e^{i\omega_2 t}+c.c.$ For such a system, the second order nonlinear polarization is $$P^{(2)}=\varepsilon_0\chi^{(2)}[E_1^2 e^{-i2\omega_1 t}+(E_1^*)^2 e^{i2\omega_1 t}+(E_1^*)^2 e^{i2\omega_1 t}+ \\ E_2^2 e^{-i2\omega_2 t}+(E_2^*)^2 e^{i2\omega_2 t}+2E_1E_2 e^{-i(\omega_1+\omega_2)t}+ \\ 2E_1^*E_2^* e^{i(\omega_1+\omega_2)t}+2E_1E_2^* e^{-i(\omega_1-\omega_2)t}+ \\ 2E_1^*E_2 e^{i(\omega_1-\omega_2)t}]+\varepsilon_0\chi^{(2)}[2E_1E_1^*+2E_2E_2^*]. \quad (3)$$

This expression includes the second harmonic terms $2\omega_1$ and $2\omega_2$ as well as the sum and difference frequency (three-wave mixing) components $\omega_1+\omega_2$ and $\omega_1-\omega_2$. If $\omega_1=\omega_2$, the mixing is called degenerate. In addition, there is a component corresponding to a time independent polarization density that creates a time-independent field across the material despite a time varying signal being applied. This is the rectification effect. Similarly, when driven by an electric field having three frequency components, $E(t)=E_1 e^{i\omega_1 t}+E_2 e^{i\omega_2 t}+E_3 e^{i\omega_3 t}+c.c.$, third-order nonlinear polarization results in multiple four wave mixing components.

$$P(3\omega_1)=\varepsilon_0\chi^{(3)}E_1^3; P(3\omega_2)=\varepsilon_0\omega^{(3)}E_2^3; P(3\omega_3)=\varepsilon_0\chi^{(3)}E_3^3; P(\omega_1+\omega_2+\omega_3)=6\varepsilon_0\omega^{(3)}E_1E_2E_3; \\ P(\omega_1+\omega_2-\omega_3)=6\varepsilon_0\chi^{(3)}E_1E_2E_3^*; \\ P(\omega_1-\omega_2+\omega_3)=6\varepsilon_0\chi^{(3)}E_1E_2^*E_3; \\ P(-\omega_1+\omega_2+\omega_3)=6\varepsilon_0\chi^{(3)}E_1^*E_2E_3; \quad (4)$$

Piezoelectricity consists of two reciprocal effects. The direct effect is the generation of charge polarization as a result of applied stress on the material, while the inverse effect is the generation of strain by applied electric field across the material. The piezoelectric constituent equations are $$S_{ij}=s_{ijkl}T_{kl}+d_{ijn}E_n; D_m=d_{mkl}T_{kl}+\varepsilon_{mn}E_n. \quad (5)$$

The first equation represents the inverse piezoelectric effect while the second equation represents the direct effect. Here S is the strain tensor of rank 2 (dimensionless), s is the compliance tensor of rank 4 (m$^2$/N), T is the stress tensor of rank 2 (N/m$^2$), d is the rank 3 piezoelectric coefficient (C/N), $\varepsilon$ is the rank 2 material permittivity (F/m), $\varepsilon$ is the electric field (N/C) and D is the displacement field (C/m$^2$). These constituent equations are only valid in the linear low electric field regime. In the presence of high-intensity electric fields, the displacement field D contains additional terms in nonlinear in the applied electric field, as the polarization field P is no longer simply proportional to E. These nonlinear interactions also produce multiple frequency components when E is sinusoidal. The techniques described herein are independent of the source of nonlinearity, but utilize some nonlinearity that exists in the material.

The acoustic medium coupled to the piezoelectric material then allows generation of all frequency components produced by nonlinear interactions, resulting in an effectively nonlinear acoustic medium, the subject of this invention.

Example

A micron-sized piezoelectric MEMS resonator illustrated in FIG. 1A, comprising of a piezoelectric layer between two layers of metallic electrodes, attached to a suspended silicon resonator. In this embodiment, the piezoelectric material is AlN. The AlN layer has a non-centrosymmetric crystalline structure, enabling both second and third harmonic generation, whereas the underlying silicon layer with centrosymmetric crystal structure contributes only to third harmonic generation. In order to detect ultra-small signals arising from nonlinear interactions, a multiport design is used to actuate and detect the resonator response. With multiple ports, the resonator can be operated in a common mode configuration to increase the signal-to-noise ratio and avoid electrical mixing.

The micrograph in FIG. 1A shows the plate-type four-port piezoelectric resonator embodiment, with a size of 250 by 100 microns. Some embodiments will consist of a different geometry, including rectangles with different aspect ratios, circles, and ellipses. The techniques described herein cover all suitable geometries and layer structures that give rise to the nonlinear acoustic effect through piezoelectric coupling.

The resonator consists of two layers of gold (each 1 micron thick) which sandwich the AlN (2 microns thick) piezoelectric layer, followed by layers of silicon oxide and bulk structural silicon layers. In this demonstration, the highest power of 5 dBm (or 1.125 V peak-to-peak) across a 2-micron layer of AlN corresponds to a maximum attainable electric field of 0.563 million volt/m peak-to-peak, calculated from the AlN thickness. The suspended resonator is connected to the substrate by thin anchors. The top gold layer is deposited in the form of four sets of interdigitated transducer (IDT) electrodes, each set comprised of two electrodes and connected to one of the four square gold tabs on all four sides of the device. These tabs (marked as P1 through P4) are the four ports of the resonator device, used symmetrically to provide a radio frequency (RF) input to or output signal from the device. In this demonstration, output signals are measured at port 4 (P4) while inputs are provided at ports 1 to 3 (P1, P2, P3), as needed. The other two square tabs (marked with G), on all four sides of the device, which flank the P-tabs are connected to ground. As shown in FIG. 1B, function generators were used to provide either two or three RF inputs (as required) at ports 1 to 3 while the output was measured by a spectrum analyzer connected to port 4 (P4) after being amplified by a low noise amplifier.

Figures 2A, 2B, 2C:
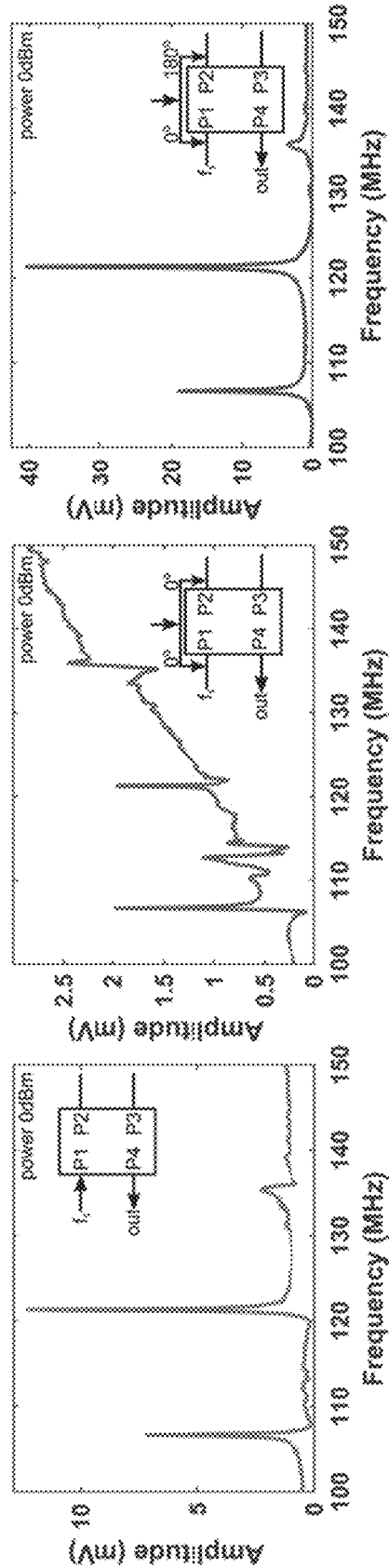
FIG. 2A shows a plot of amplitude versus frequency for a resonator including a port (P1) used to provide an excitation signal and a port (P2) from which a response signal is collected.
FIG. 2B shows a plot of amplitude versus frequency for a resonator including ports (P1 and P2) used to provide similar excitation signals and a port (P4) from which a response signal is collected.
FIG. 2C shows a plot of amplitude versus frequency for a resonator including ports (P1 and P2) used to provide different excitation signals and a port (P4) from which a response signal is collected.

First, the frequency was swept between 100 and 150 MHz at port 1 (P1) of the resonator device while a response was recorded at port 4 (P4). The response, shown in FIG. 2A, shows two well-defined resonance peaks, at 106.69 MHz and 121.3 MHz. These are two distinct acoustic modes, which can be seen in finite-element COMSOL simulations. Outside the resonance peaks, the signal contains considerable noise. The same input signal was then applied to both ports 1 and 2 (P1 & P2). The results of this are shown in FIG. 2B, which illustrates a reduction of the signal and increase in noise. The main resonance peak at 121.3 MHz is also reduced in amplitude. Finally, same frequency sweep input signal is applied and split at port 1 (P1) while a 180-degree out-of-phase component is applied at port 2 (P2). This common mode rejection response is shown in FIG. 2C, which depicts an increase in the signal-to-noise ratio in comparison to the response shown in FIG. 2A. In this case, the application of the same signal with a 180-degree phase difference at two consecutive ports results in the cancelling of the common mode noise signals, which are applied equally to both parts of the inputs. In some embodiments, this scheme is employed to decrease noise in the device. For nonlinear frequency mixing measurements, it also allows application of different frequency signals at different ports without any electrical signal mixing.

This particular embodiment has major resonance peaks at the frequencies of 121.3 MHz, 106.69 MHz, and 33.56 MHz. A three-wave mixing scheme was next used for second harmonic generation using two frequencies ($f_1$ & $f_2$) applied to ports 1 and 2 (P1 & P2) at 0 dBm while an output is recorded at port 4 (P4). The response plots for these frequency pairs $f_1$=121.3 MHz and $f_2$=106.69 MHz, $f_1$=121.3 MHz and $f_2$=33.56 MHz and $f_1$=106.69 MHz and $f_2$=33.56 MHz are shown in FIGS. 3A-3C respectively. The algebraic sum and difference components are observed in each of the plots.

Next the threshold input signal power, that is, at which the first component of harmonic generation appears, was explored for the two frequencies $f_1$=121.3 MHz, $f_2$=106.69 MHz, applied at ports 1 and 2 (P1 & P2). FIG. 3D shows the linear response containing only the two resonance peaks at input signal power of −45 dBm. When the power is increased, as shown in FIG. 3E, it is observed that the third harmonic component, at a frequency of $3f_1$, appears at −35 dBm. Silicon, which forms the structural base of the resonator, is a dielectric; because it has an inversion-symmetric crystalline structure, it produces only the third harmonic component. As the power is increased further to 0 dBm, it is observed the linear response plus second and third harmonic components, as shown in FIG. 3F. Here, the second harmonic component is entirely due to the aluminum nitride layer, a known nonlinear material with non-centrosymmetric crystal structure. As discussed earlier, in an acoustic nonlinear medium such as the hybrid micron-sized resonator, three-wave mixing produces a complete set of frequency components.

Next, three frequency signals were input, $f_1$=121.3 MHz at port 1 (P1), $f_2$=106.69 MHz at port 2 (P2) and $f_3$=33.56 MHz at port 3 (P3), each at 5 dBm. Complete four-wave mixing is observed. As shown in FIG. 4, the linear response plus second, third, and fourth harmonics are visible. Here, for easier viewing, signals related to components consisting of various positive combinations of two out of the three applied frequencies have been greyed out, while those representing only four-wave mixing are colored. The signal color (red, blue or purple) corresponds to the algebraic component labeled above the peaks. The applied input signal peaks and their multiples are shown in black. Each signal corresponds to within two decimal places of the actual analytical calculation. It is noteworthy that increasing the power of the applied signals further increases the amplitudes of the resultant components and also adds higher harmonics.

The effect of the applied electric field on the peak height of the first, second, third and fourth harmonic for the 121.3 MHz mode were investigated further. A signal at frequency ($f_1$) was applied to P1 (port 1) and the response at P4 (port 4) was measured. The log-log plot of this dependence is shown in FIG. 4B. The four data sets, corresponding to the four harmonics, are each overlaid with a linear fit. As expected from the field dependence of polarization, $P \sim \varepsilon_0(\chi^{(1)}E + \chi^{(2)}E^2 + \chi^{(3)}E^3 + \chi^{(4)}E^4 + \ldots)$ the first four harmonic peaks scale with a power law dependence with exponents approximately equal to 1, 2, 3, and 4 respectively. Such a response definitively demonstrates nonlinear acoustic media. The first-order susceptibility $\chi^{(1)}$ is a property of the material, which for aluminum nitride (AlN) is known to be 4.8 along the c-axis. Starting with a fixed electric field value of 100 kV/m, the second-order susceptibility $\chi^{(2)}$ is estimated to be $4.3 \times 10^{-6}$ m/V, third-order susceptibility $\chi^{(3)}$ is $21.5 \times 10^{-12}$ m/V and fourth-order susceptibility $\chi^{(4)}$ is $20.0 \times 10^{-18}$ m/V, at a frequency of 121.3 MHz at a temperature of 300K. Some embodiments, employing different materials and/or different temperatures, will have different higher-order susceptibilities. Further measurements of higher harmonics for two additional mode frequencies of 106 MHz and 33 MHz display similar trends.

Realization of a nonlinear acoustic medium, which verifies the attainability of this invention, was demonstrated by the observation of the entire suite of three-wave and four-wave mixing components. In addition to enabling the study of a broad range of novel nonlinear acoustics effects, the techniques described herein can enable enhanced applications in micron-scale devices, including frequency multipliers, chip-scale frequency-comb generators, pump-and-probe processors and other nonlinear signal processing devices.

What is claimed is:

1. A nonlinear acoustic media configured to generate higher harmonic output signals from a single-frequency input signal, wherein the higher harmonic output signals are generated through the coupling of an acoustic dielectric medium to a nonlinear piezoelectric medium having four ports.

2. A method comprising generating higher harmonic output signals using a nonlinear acoustic media from a single-frequency input signal by coupling an acoustic dielectric medium to a nonlinear piezoelectric medium having four ports.

* * * * *